(12) United States Patent
Kim et al.

(10) Patent No.: US 8,913,220 B2
(45) Date of Patent: Dec. 16, 2014

(54) LIQUID CRYSTAL DISPLAY DEVICE HAVING A CONTACT HOLE HAVING AN UNDERCUT SHAPE

(75) Inventors: Jeong-Oh Kim, Seoul (KR); Yong-Il Kim, Cheonggeum-Ri (KR)

(73) Assignee: LG Display Co., Ltd., Seoul (KR)

( * ) Notice: Subject to any disclaimer, the term of this patent is extended or adjusted under 35 U.S.C. 154(b) by 307 days.

(21) Appl. No.: 13/271,728

(22) Filed: Oct. 12, 2011

(65) Prior Publication Data

US 2012/0086881 A1 Apr. 12, 2012

(30) Foreign Application Priority Data

Oct. 12, 2010 (KR) ........................ 10-2010-0099500

(51) Int. Cl.
*G02F 1/136* (2006.01)
*G02F 1/1333* (2006.01)
*H01L 27/12* (2006.01)
*G02F 1/1343* (2006.01)
*G02F 1/1362* (2006.01)

(52) U.S. Cl.
CPC ...... *H01L 27/1288* (2013.01); *G02F 1/134363* (2013.01); *G02F 1/136227* (2013.01); *G02F 2001/134372* (2013.01)
USPC ................................ 349/138; 349/42; 349/43

(58) Field of Classification Search
USPC ...................................... 349/141, 42–43, 138
See application file for complete search history.

(56) References Cited

U.S. PATENT DOCUMENTS

| | | | |
|---|---|---|---|
| 5,243,202 A * | 9/1993 | Mori et al. ........................ 257/59 |
| 2003/0168746 A1 | 9/2003 | You | |
| 2006/0033854 A1* | 2/2006 | Park et al. ........................ 349/43 |
| 2006/0290867 A1* | 12/2006 | Ahn et al. ....................... 349/141 |
| 2007/0013853 A1* | 1/2007 | Saigo et al. .................... 349/141 |
| 2007/0087486 A1* | 4/2007 | Tanaka ............................ 438/149 |
| 2008/0061446 A1* | 3/2008 | You ................................ 257/774 |
| 2010/0163862 A1* | 7/2010 | Yang et al. ....................... 257/43 |

FOREIGN PATENT DOCUMENTS

| | | |
|---|---|---|
| CN | 1605918 A | 4/2005 |
| CN | 1892385 A | 1/2007 |

OTHER PUBLICATIONS

Office Action issued in corresponding Taiwan Patent Application No. 100137011, mailed Dec. 24, 2013, 8 pages.
Office Action issued in corresponding Chinese Patent Application No. 201110384918.7, mailed Jan. 24, 2014, 12 pages.

\* cited by examiner

*Primary Examiner* — Lauren Nguyen
(74) *Attorney, Agent, or Firm* — Brinks Gilson & Lione

(57) ABSTRACT

An array substrate for a liquid crystal display (LCD) device include: a substrate; a gate line formed in one direction on one surface of the substrate; a data line crossing the gate line to define a pixel area; a thin film transistor (TFT) configured at a crossing of the gate line and the data line; a pixel electrode formed at a pixel region of the substrate; an insulating film formed on the entire surface of the substrate including the pixel electrode and the TFT, including a first insulating film formed of a high temperature silicon nitride film and a second insulating film formed of a low temperature silicon nitride film, and having a contact hole having an undercut shape exposing the pixel electrode; a pixel electrode connection pattern formed within the contact hole having an undercut shape and connected with the pixel electrode and the TFT; and a plurality of common electrodes separately formed on the insulating film.

11 Claims, 13 Drawing Sheets

LIQUID CRYSTAL DISPLAY DEVICE HAVING A CONTACT HOLE HAVING AN UNDERCUT SHAPE

Pursuant to 35 U.S.C. §119(a), this application claims the benefit of earlier filing date and right of priority to Korean Application 10-2010-0099500, filed on Oct. 12, 2010, the content of which is incorporated by reference herein in its entirety.

BACKGROUND

1. Field of the Invention

The present disclosure relates to a liquid crystal display device and, more particularly, to an array substrate for a liquid crystal display device and a fabrication method thereof.

2. Discussion of the Related Art

In general, the driving principle of a liquid crystal display (LCD) device uses an optical anisotropy and polarization properties of liquid crystal. Liquid crystals have a thin, long structure, so they have orientation in an alignment of molecules, and the direction of the alignment of molecules can be controlled by intentionally applying an electric field to the liquid crystal.

Thus, when the direction of the alignment of molecules of the liquid crystal is adjusted, the alignment of molecules of the liquid crystal can be changed, and light is refracted in the direction of the molecular alignment of the liquid crystal by optical anisotropy, thus displaying image information.

Currently, an active matrix liquid crystal display (AM-LCD) (which will be referred to as an 'LCD', hereinafter) in which thin film transistors (TFTs) and pixel electrodes connected to the TFTs are arranged in a matrix form has come to prominence because of its excellent resolution and video implementation capabilities.

The LCD includes a color filter substrate (i.e., an upper substrate) on which a common electrode is formed), an array substrate (i.e., a lower substrate) on which pixel electrodes are formed, and liquid crystal filled between the upper substrate and the lower substrate. In the LCD, the common electrode and the pixel electrodes drive liquid crystal by an electric field applied vertically, having excellent characteristics of transmittance, aperture ratio, and the like.

However, the driving of liquid crystal by the electric field applied vertically is disadvantageous in that viewing angle characteristics are not good. Thus, in order to overcome the shortcomings, a method for driving liquid crystal by in-plane field has been newly proposed. The method for driving liquid crystal by in-plane field has excellent viewing angle characteristics.

In the in-plane switching mode LCD is configured such that a color filter substrate and an array substrate face each other, and a liquid crystal is interposed therebetween.

On the array substrate, a TFT, a common electrode, and a pixel electrode are formed on each of a plurality of pixels defined on the transparent insulating substrate.

Also, the common electrode and the pixel electrode are separated to be parallel on the same substrate.

The color filter substrate include black matrixes at portions corresponding to gate lines, data lines, and the TFTs on the transparent insulating substrate, and color filters are formed to corresponds to the pixels.

The liquid crystal layer is driven by an in-plane field of the common electrode and the pixel electrode.

In the in-plane switching mode LCD configured as described above, the common electrode and the pixel electrode are formed as transparent electrodes in order to secure luminance, but only portions of both ends of the common electrode and the pixel electrode contribute to improvement of the luminance due to the distance between the common electrode and the pixel electrode in terms of design and most regions block light.

Thus, a fringe field switching (FFS) technique has been proposed to maximize the luminance improvement effect. The FFS technique precisely controls liquid crystal to eliminate a color shift and obtain high contract ratio, implementing high screen quality compared with the general in-plane switching technique.

However, although the related art FFS mode LCD can implement a wide viewing angle in left and right viewing angles, as the size of the LCD is increased, the lateral viewing angle and upper and lower viewing angles are required to be further improved.

The related art FFS mode LCD will now be described with reference to FIG. 1.

FIG. 1 is a plan view of an array substrate of the related art LCD device.

As shown in FIG. 1, the array substrate for the related art LCD device includes a plurality of gate lines 17b extending in one direction and separated to be parallel on a substrate 11, a plurality of data lines 29c crossing the gate lines 17b and defining pixel regions at the crossings of the gate lines 17b and the data lines 29c; and a thin film transistor (T) provided at the crossing of the gate line 17b and the data line 29c and including a gate electrode 17a, an active layer (not shown), a source electrode 29a, and a drain electrode 29b.

Also, a transparent pixel electrode 13a is disposed to be separated from the gate line 17b and the data line 29c on the entire surface of the pixel region, and a plurality of transparent common electrodes 39a having a bar-like shape are disposed at an upper portion of the pixel electrode 13a with an insulating film (not shown) interposed therebetween.

The pixel electrode 13a is electrically connected by a pixel electrode connection pattern 39b connected with the drain electrode 29b.

Lateral ends of the plurality of common electrodes 39a having a bar-like shape are connected with the common electrode connection pattern 39c, and a portion of the common electrode connection pattern 39c is disposed to be parallel to the gate line 17b.

Meanwhile, in case of exposing to form a contact hole 37 for connecting the pixel electrode 13a and the drain electrode 29b, an overlay margin M1 of about 2 μm is required between one end of each of the plurality of common electrodes 39a and the pixel electrode connection pattern 39b, and a short margin of about 4 μm is required between the pixel electrode connection pattern 39b and the edge of the side of the common electrode 39a, reducing the upper common electrode 39a, which leads to a reduction in the aperture ratio of the common electrode, an increase in the black matrix used for blocking light, and a reduction in transmittance.

A method for fabricating the array substrate for an in-plane switching (IPS) mode LCD device according to the related art configured as described above will be described as follows.

FIGS. 2A to 2O are sectional views taken along line II-II in FIG. 1 of the array substrate for an LCD device according to the related art.

FIG. 3 is a sectional view showing the process of fabricating the array substrate for an LCD device according to the related art, which explains a defective disconnection of a pixel electrode during an exposure process for patterning a common electrode.

As shown in FIG. 2A, a plurality of pixel regions including a switching region are defined on the transparent insulating substrate 11, an ITO layer 13 is deposited on the transparent insulating substrate 11 through sputtering, and then, a first photosensitive film 15 is applied on the ITO layer 13.

As shown in FIG. 2B, the first photosensitive film 15 is exposed and developed through a first masking process using photolithography to selectively pattern the first photosensitive film 15 to form a first photosensitive film pattern 15a.

As shown in FIG. 2C, the ITO layer 13 is selectively patterned by using the first photosensitive film pattern 15a to form the pixel electrode 13a.

Thereafter, the first photosensitive film pattern 15a is removed, a gate electrode metal layer 17 is deposited on the entire surface of the substrate including the pixel electrode 13a through sputtering, and a second photosensitive film 19 is coated thereon.

As shown in FIG. 2D, the second photosensitive film 19 is exposed and developed through photolithography so as to be selectively patterned to form a second photosensitive film pattern 19a.

As shown in FIG. 2E, the metal layer 17 is selectively patterned by using the second photosensitive film pattern 19a as a mask to form a gate line (not shown) along with the gate electrode 17a.

As shown in FIG. 2F, the second photosensitive film pattern 19a is removed, a gate oxide film 21, an amorphous silicon layer 23, and an amorphous silicon layer 25 including impurities are sequentially deposited on the entire surface of the substrate including the gate electrode 17a and the pixel electrode 13a, and then, a third photosensitive film 27 is coated on the amorphous silicon layer 25 including impurities.

As shown in FIG. 2G, the third photosensitive film 27 is exposed and developed so as to be patterned through a third masking process using photolithography to form a third photosensitive film pattern 27a.

As shown in FIG. 2H, the amorphous silicon layer 25 containing impurities and the amorphous silicon layer 23 are selectively patterned by using the third photosensitive film pattern 27a as a mask to form an ohmic-contact layer 25a and an active layer 23a overlapping with the gate electrode 17a.

Thereafter, the third photosensitive film pattern 27a is removed, a metal layer 29 is deposited on the entire surface of the substrate including the active layer 23a and the ohmic-contact layer 25a, and then, a fourth photosensitive film 31 is coated on the metal layer 29.

As shown in FIG. 2I, the fourth photosensitive film 31 is exposed and developed so as to be patterned through a fourth masking process using photolithography to form a fourth photosensitive film pattern 31a.

As shown in FIG. 2J, the metal layer 29 is selectively patterned by using the fourth photosensitive film pattern 31a as a mask to form separated source and drain electrodes 29a and 29b and a data line (not shown). At this time, a portion of the ohmic-contact layer 25a exposed between the source and drain electrodes 29a and 29b is also removed to form a channel region of the active layer 23a.

As shown in FIG. 2K, the fourth photosensitive film pattern 31a is removed, a protective film 33 is deposited on the entire surface of the substrate including the source and drain electrodes 29a and 29b, and then, a fifth photosensitive film 35 is coated on the protective film 33.

As shown in FIG. 2L, the fifth photosensitive film 35 is exposed and developed so as to be patterned through a fifth masking process using photolithography to form a fifth photosensitive film pattern 35a.

Subsequently, the protective film 33 and the gate insulating film 21 are sequentially etched by using the fifth photosensitive film pattern 35a as a mask to form a contact hole 37 exposing portions of the drain electrode 29b and the pixel electrode 13a.

As shown in FIG. 2M, the fifth photosensitive film pattern 35a is removed, an ITO layer 39 is deposited on the protective film 33 including the contact hole 37 through sputtering, and then, a sixth photosensitive film 41 is coated on the ITO layer 39.

As shown in FIG. 2N, the sixth photosensitive film 41 is exposed and developed so as to be patterned through a sixth masking process using photolithography to form sixth photosensitive film patterns 41a and 41b. At this time, the sixth photosensitive film pattern 41a is formed at an upper portion of the ITO layer 39 corresponding to a pixel electrode connection pattern region connecting a pixel electrode and a drain electrode, and the sixth photosensitive film pattern 41b is formed at an upper portion of the ITO layer 39 corresponding to a common electrode region.

As shown in FIG. 2O, the ITO layer 39 is selectively etched by using the sixth photosensitive film patterns 41a and 41b as masks to form a pixel electrode connection pattern 39b connecting the drain electrode 29b and the pixel electrode 13a, a plurality of bar-like common electrodes 39a, and a common electrode connection pattern 39c connecting the plurality of common electrodes 39a to each other.

And then, the sixth photosensitive film patterns 41a and 41b are removed, completing the process for fabricating the array substrate for an IPS mode LCD device according to the related art.

However, as described above, when the sixth photosensitive film is exposed to form the common electrode 39a and the pixel electrode connection pattern 39b, the sixth photosensitive film pattern 41c for forming the pixel electrode connection pattern is formed only at a portion of the contact hole 37 due to misalignment as shown in FIG. 3, exposing a portion of the ITO layer 39 in contact with the pixel electrode 13a at a lower portion of the contact hole 37.

Thus, with the portion of the ITO layer 39 exposed, when the ITO layer 39 is etched by using the sixth photosensitive film pattern 41c as a mask, the ITO layer 39 at a lower portion of the contact hole 37 is etched, the underlying pixel electrode 13a is also etched together as the ITO layer 39 at a lower portion of the contact hole 37 is etched, causing the pixel electrode 13a to be disconnected.

Thus, in the related art, in order to solve the problem of the disconnection of the pixel electrode 13a caused as the underlying pixel electrode 13a is also etched together when the ITO layer 39 at a lower portion of the contact hole 37 is etched, the sixth photosensitive film pattern 41a for forming the pixel electrode connection pattern is formed up to the vicinity of the common electrode region including the contact hole 37 region.

However, since the sixth photosensitive film pattern 41a for forming the pixel electrode connection pattern is formed up to the vicinity of the common electrode region including the contact hole 37 region, the area of the common electrode is reduced as much. Namely, when the ITO layer is exposed, an overlay margin M1 of about 2 μm or greater is required between one end of the plurality of common electrode and the pixel electrode connection pattern and a short margin of about 4 μm or greater is required between the edge of the side of the common electrode and the pixel electrode connection pattern, so the area of the common electrode is reduced to reduce the aperture ratio and transmittance.

Also, in the array substrate for an LCD device and the fabrication method thereof, the array substrate for an LCD device is fabricated through the six masking processes, namely, the first masking process for forming the pixel electrode, the second masking process for forming the gate electrode, the third masking process for forming the active layer and the ohmic-contact layer, the fourth masking process for forming the source and drain electrodes, the fifth masking process for forming the contact hole to connect the drain electrode and the pixel electrode; and the sixth masking process for forming the common electrode, so the number of fabrication processes are increased to lengthen time required for the fabrication process as much.

BRIEF SUMMARY

An array substrate for an LCD device, includes: a gate line formed in one direction on one surface of a substrate; a data line crossing the gate line to define a pixel area; a thin film transistor (TFT) configured at a crossing of the gate line and the data line; a pixel electrode formed at a pixel region of the substrate; an insulating film formed on the entire surface of the substrate including the pixel electrode and the TFT, including a first insulating film formed of a high temperature silicon nitride film and a second insulating film formed of a low temperature silicon nitride film, and having a contact hole having an undercut shape exposing the pixel electrode; a pixel electrode connection pattern formed within the contact hole having an undercut shape and connected with the pixel electrode and the TFT; and a plurality of common electrodes separately formed on the insulating film.

According to another aspect of the present invention, there is provided a method for fabricating an array substrate for an LCD, including: preparing a substrate; forming a gate line arranged in one direction along with a pixel electrode on the substrate; forming a data line crossing the gate line to define a pixel area; forming a TFT at the crossing of the gate line and the data line; stacking a first insulating film formed of a high temperature silicon nitride film and a second insulating film formed of a low temperature silicon nitride film on the entire surface of the substrate including the pixel electrode and the TFT; patterning the second insulating film and the first insulating film to form a contact hole having an undercut shape exposing the pixel electrode and the TFT; forming a pixel electrode connection pattern connected with the pixel electrode and the TFT within the contact hole having an undercut shape; and forming a plurality of common electrodes separately on the second insulating film.

DETAILED DESCRIPTION OF THE DRAWINGS AND THE PRESENTLY PREFERRED EMBODIMENTS

An array substrate for a liquid crystal display (LCD) device according to an embodiment of the present invention will be described in detail with reference to the accompanying drawings.

Figure 1:
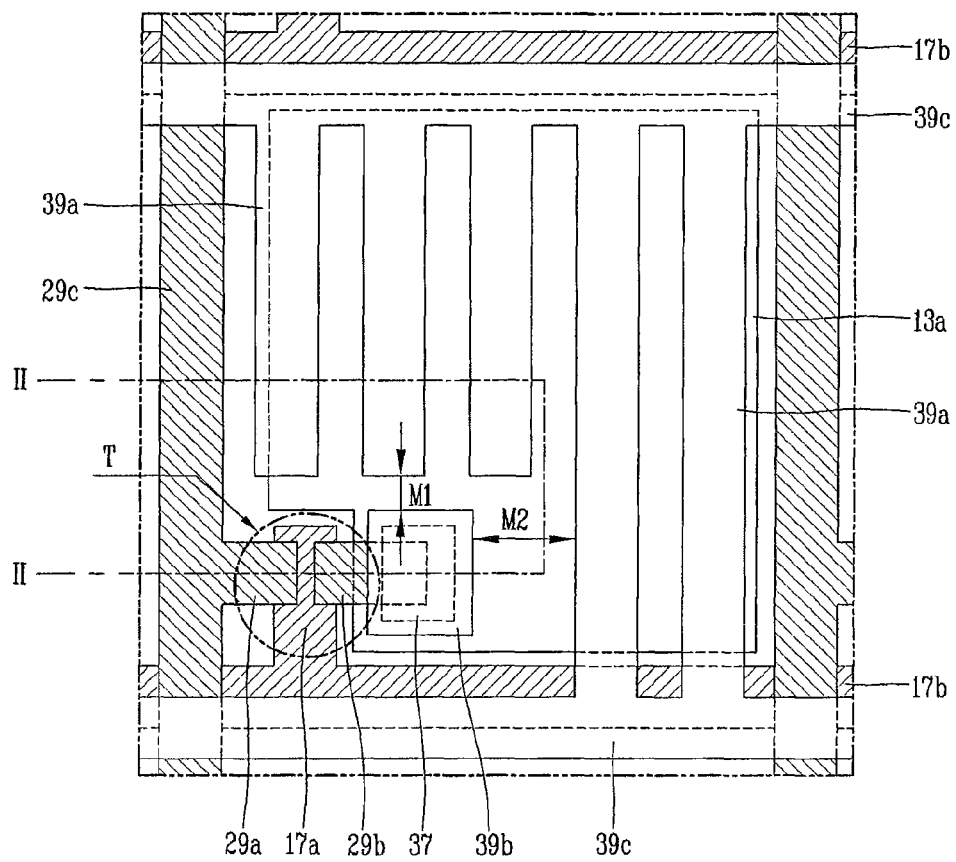
FIG. 1 is a plan view of an array substrate for a liquid crystal display (LCD) device according to the related art.
Figure 2A:
FIGS. 2A to 2O are sectional views showing a process for fabricating the array substrate for a liquid crystal display (LCD) device according to the related art, taken along line II-II in FIG. 1.
Figure 2B:
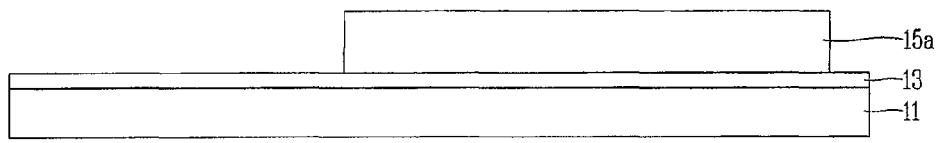
Figure 2C:
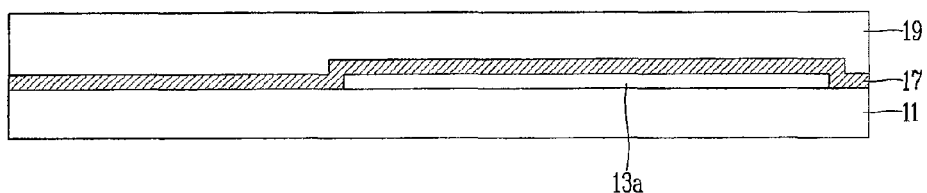
Figure 2D:
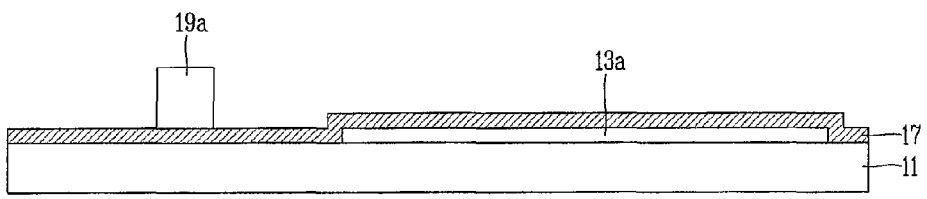
Figure 2E:
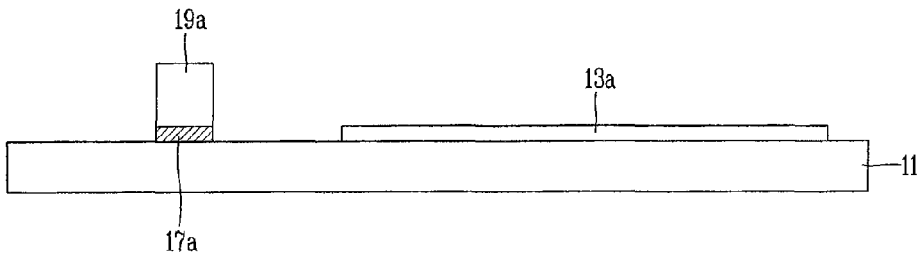
Figure 2F:
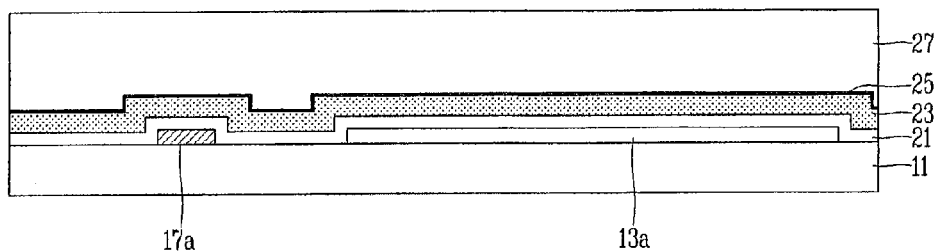
Figure 2G:
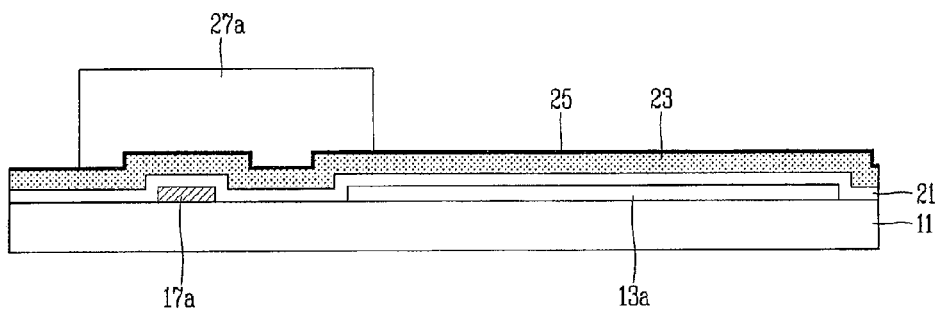
Figure 2H:
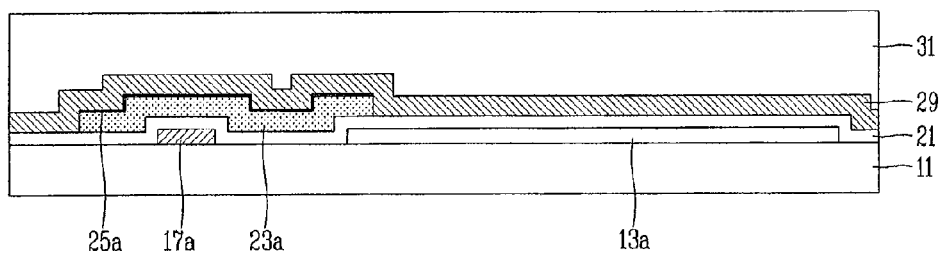
Figure 2I:
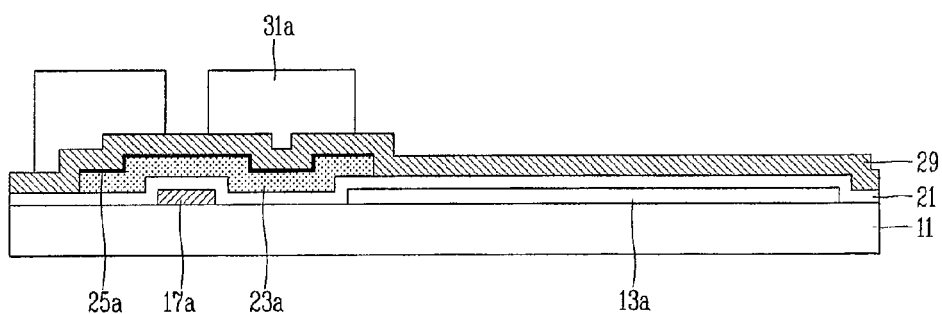
Figure 2J:
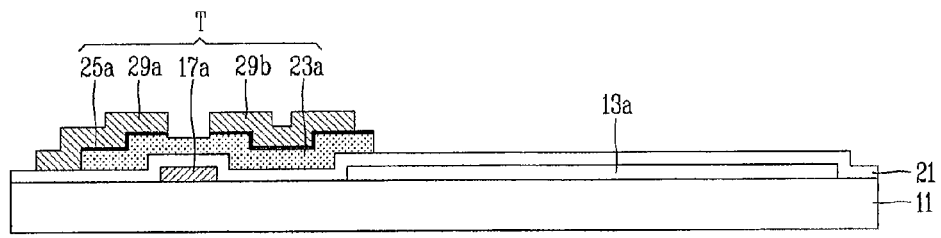
Figure 2K:
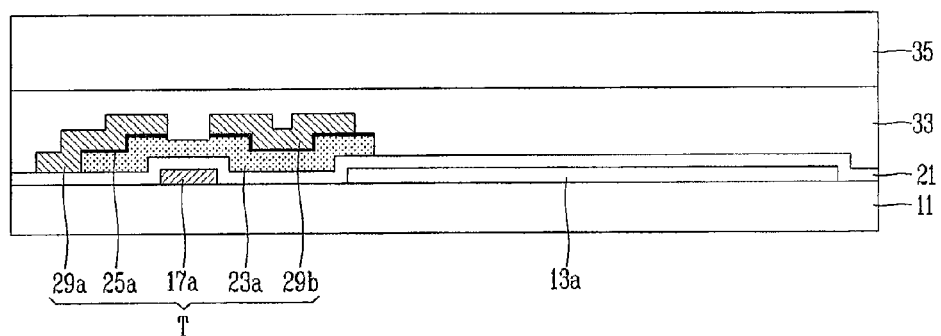
Figure 2L:
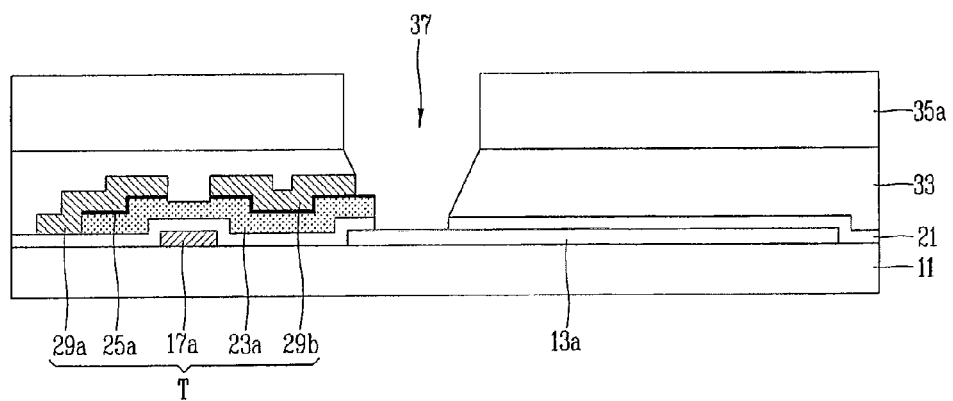
Figure 2M:
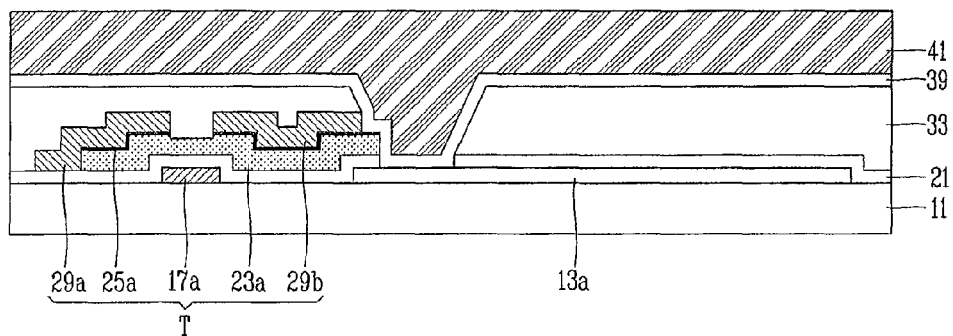
Figure 2N:
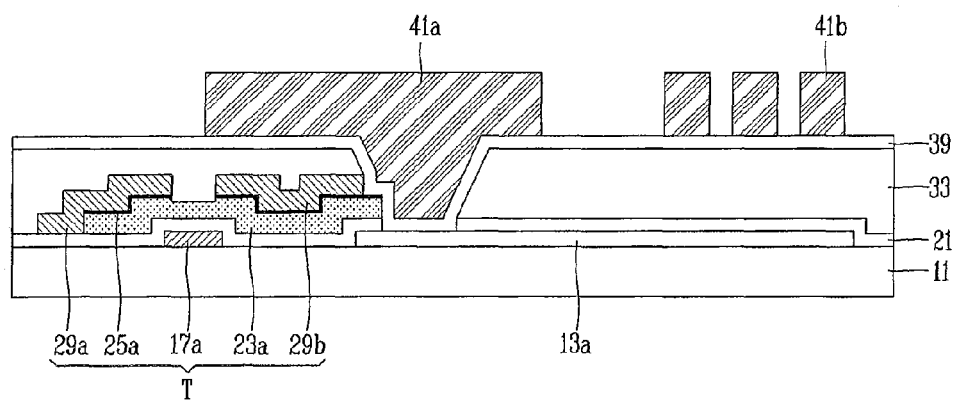
Figure 2O:
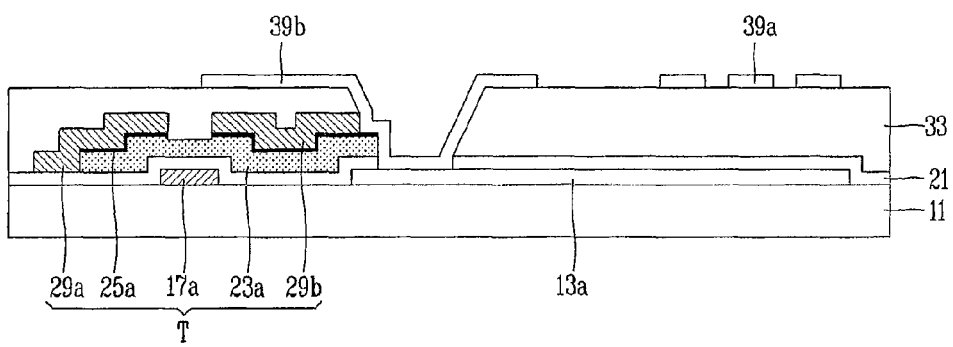
Figure 3:
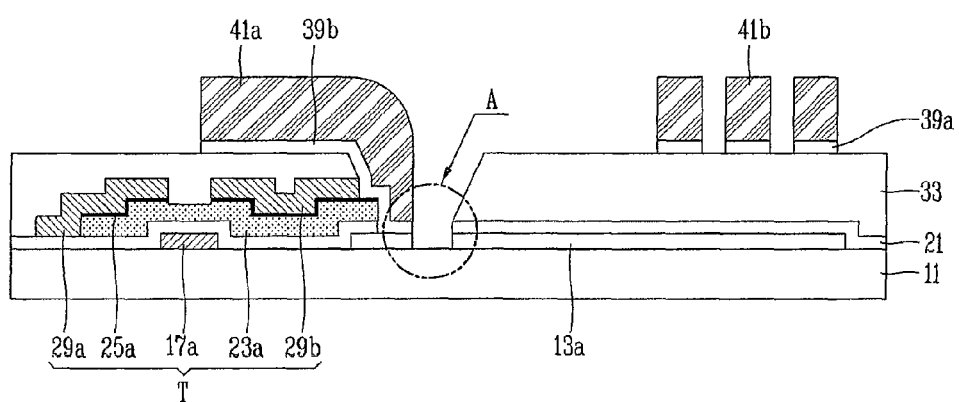
FIG. 3 is a sectional view showing the process of fabricating the array substrate for an LCD device according to the related art, which explains a defective disconnection of a pixel electrode during an exposure process for patterning a common electrode.
Figure 4:
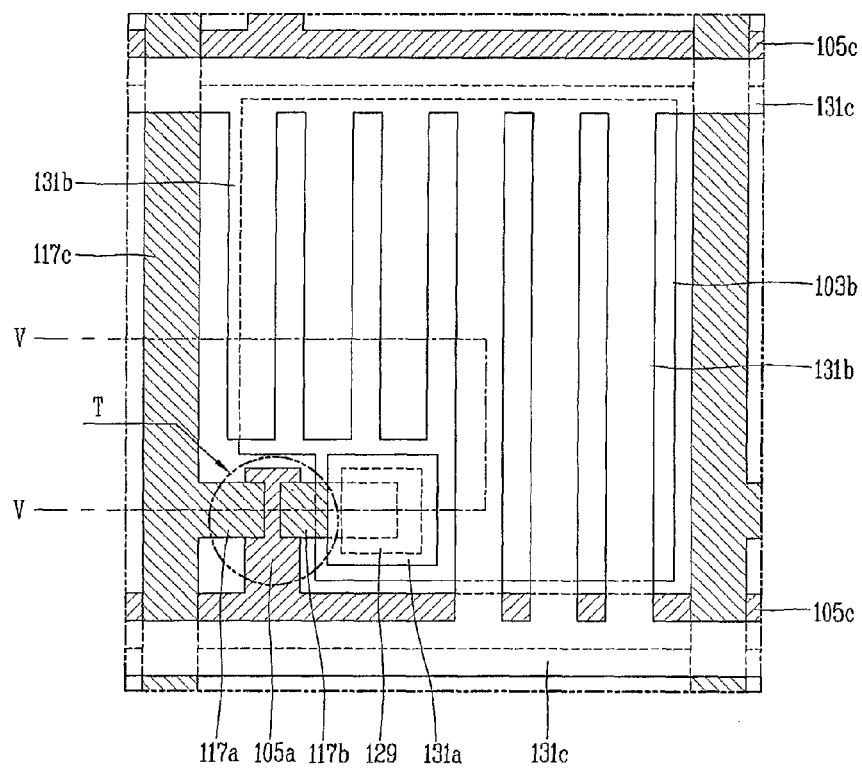
FIG. 4 is a plan view of an array substrate for a liquid crystal display (LCD) device according to an embodiment of the present invention.

FIG. 4 is a plan view of an array substrate for a liquid crystal display (LCD) device according to an embodiment of the present invention.

Figure 5:
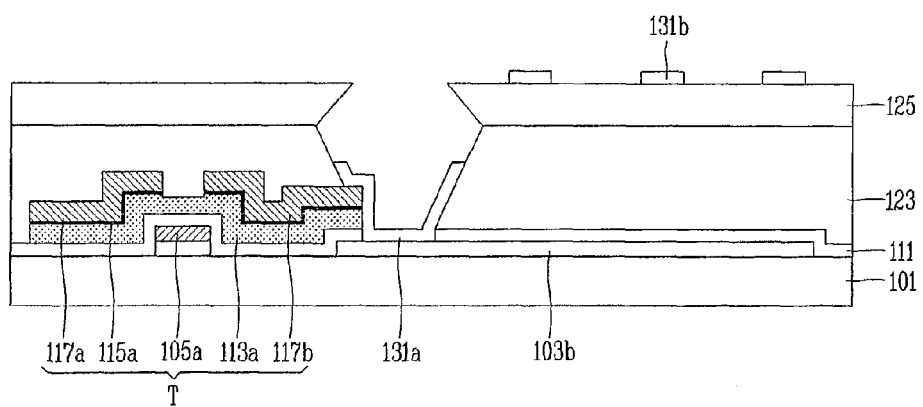
FIG. 5 is a sectional view of the array substrate for an LCD device according to an embodiment of the present invention, taken along line V-V in FIG. 4.

FIG. 5 is a sectional view of the array substrate for an LCD device according to an embodiment of the present invention, taken along line V-V in FIG. 4.

The LCD device according to an embodiment of the present invention is an advanced horizontal in-plane switching (AH-IPS) mode LCD device proposed to improve side and upper and lower viewing angles and transmittance.

As shown in FIGS. 4 and 5, the array substrate for an LCD device according to an embodiment of the present invention includes a plurality of gate lines 105c extending in one direction and separated to be parallel on a substrate 101, a plurality of data lines 117c crossing the gate lines 105c and defining pixel regions at the crossings of the gate lines 105c and the data lines 117c; and a thin film transistor (T) provided at the crossing of the gate line 105c and the data line 117c and including a gate electrode 105a, an active layer (not shown), a source electrode 117a, and a drain electrode 117b.

Also, a transparent pixel electrode 103b is disposed to be separated from the gate line 105c and the data line 117c on the entire surface of the pixel region, and a plurality of transparent common electrodes 131b having a bar-like shape are disposed at an upper portion of the pixel electrode 103b with an insulating film (not shown) having heterogeneous characteristics interposed therebetween.

Here, the plurality of transparent common electrodes 131b having a bar-like shape are disposed to be parallel to the data lines 117c, and are spaced apart by a certain interval from each other.

The pixel electrode 103b is electrically connected with the drain electrode 117b by a pixel electrode connection pattern 131a through a contact hole 129 having an undercut shape formed in an insulating film (not shown) (Refer to 123 and 125 in FIG. 5) having a dual-structure having heterogeneous characteristics. Here, the contact hole 129 having an undercut shape includes a tapered structure of the first insulating film 123 and a reversely tapered structure of the second insulating film 125. The pixel electrode connection pattern 131a is in contact with the drain electrode 117b having the tapered structure of the first insulating film 123 and the pixel electrode 103b.

In addition, both lateral ends of the plurality of common electrodes 131b having a bar-like shape are connected with a common electrode connection pattern 131c disposed such that a portion thereof is parallel to the gate line 105c. here, the plurality of common electrodes 131b having a bar-like shape are formed to be spaced apart by a certain interval on the upper surface of the second insulating film 125.

As shown in FIG. 5, the pixel electrode connection pattern 131a is formed on the surface of the tapered structure of the first insulating film 123 among the dual-structure insulating films having heterogeneous characteristics, and the common electrodes 131b are formed on the second insulating film 125 having a step difference of a certain height from the first insulating film 123. Thus, the overlay margin M1 between the pixel electrode connection pattern and one lateral end of the common electrode and the short margin M2 between the pixel electrode connection pattern and the edge of the common electrode during the exposure process of forming the common electrode and the pixel electrode connection pattern as in the related art. Namely, in an embodiment of the present invention, although the common electrodes 131b are formed at the upper portion of the second insulating film 125 having the reversely tapered structure, the pixel electrode connection pattern 131a and the common electrodes 131b are not in contact due to the step difference between the first insulating film 123 and the second insulating film 125.

Thus, since the common electrodes 131b are formed on the area which does not have an overlap margin with the pixel electrode connection pattern 131a, namely, on the upper portion of the reversely tapered structure of the second insulating film 125, the area of the common electrode can be increased as much compared with the related art, thus improving the aperture ratio and transmittance.

The method for fabricating the array substrate for an LCD device according to an embodiment of the present invention configured as described above will be described with reference to FIGS. 6A to 6Q as follows.

Figure 6A:
FIGS. 6A to 6Q are sectional views of a process for fabricating the array substrate for an LCD device according to an embodiment of the present invention.
Figure 6B:
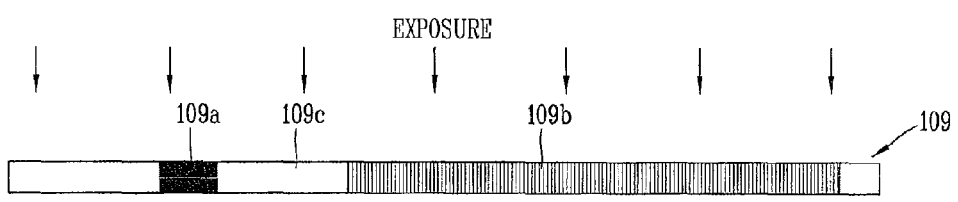
Figure 6C:
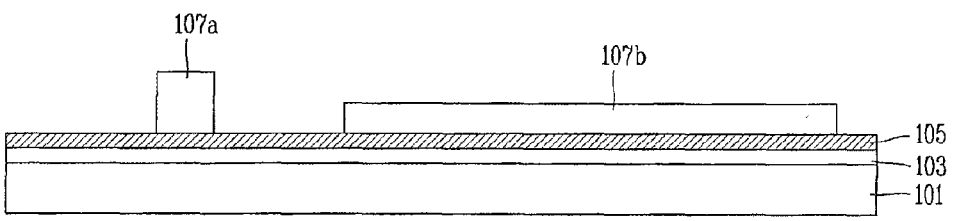
Figure 6D:
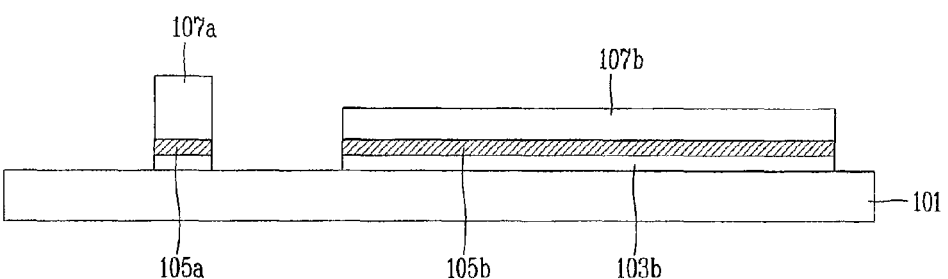
Figure 6E:
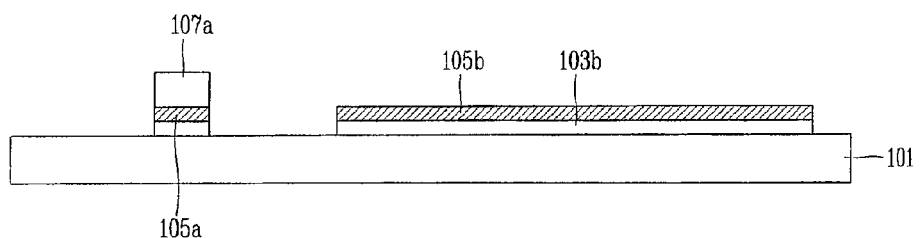
Figure 6F:
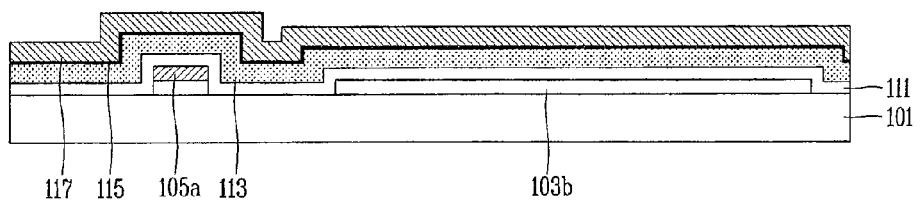
Figure 6G:
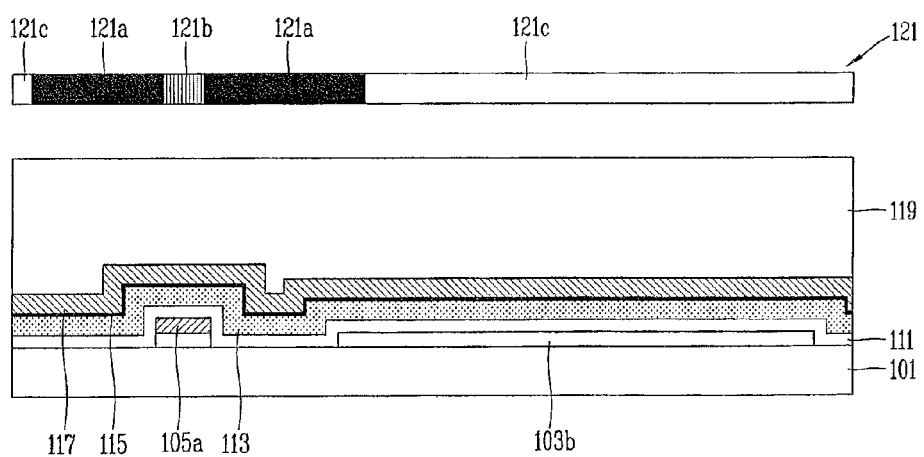
Figure 6H:
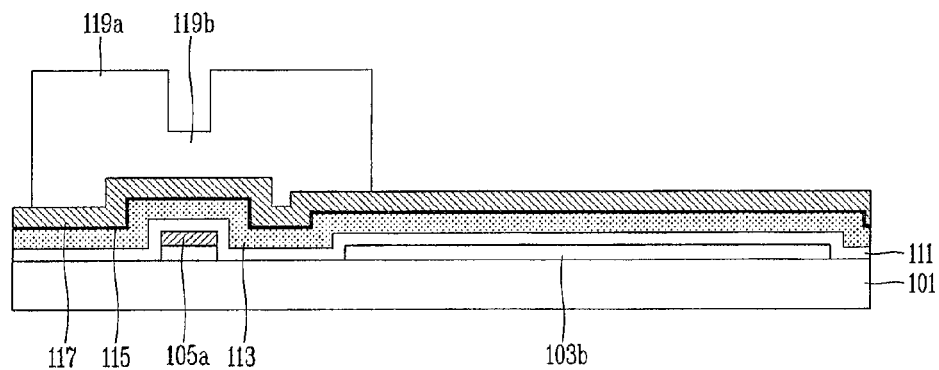
Figure 6I:
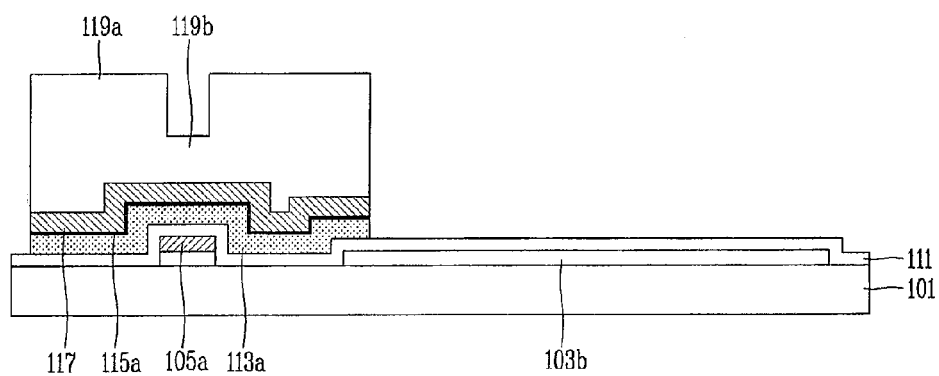
Figure 6J:
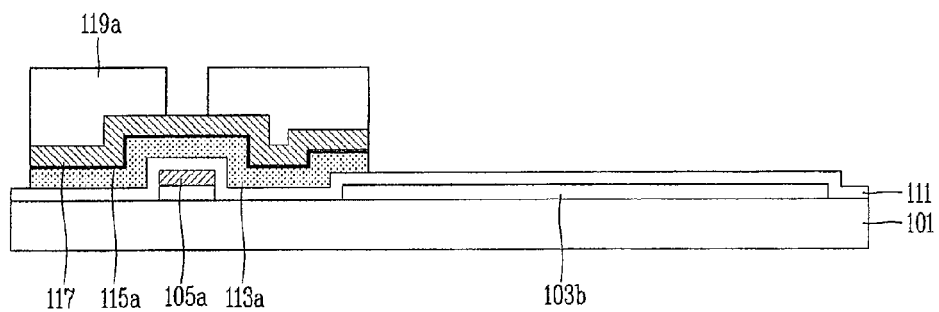
Figure 6K:
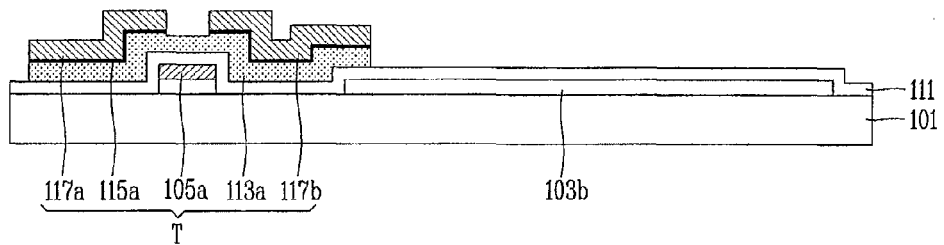
Figure 6L:
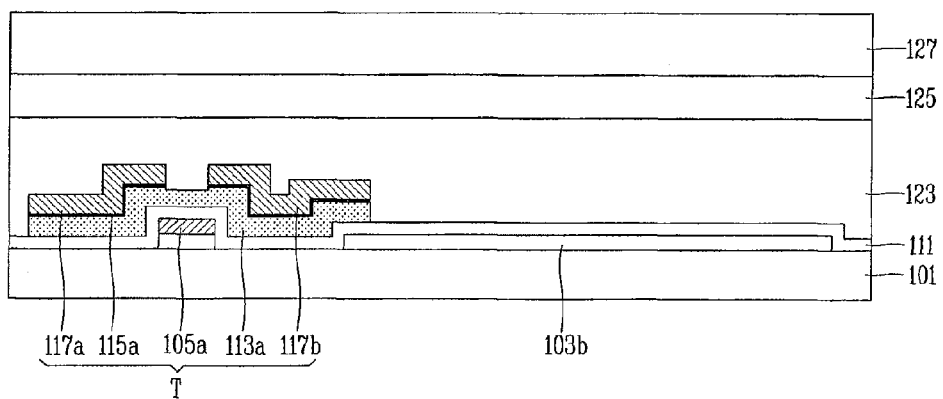
Figure 6M:
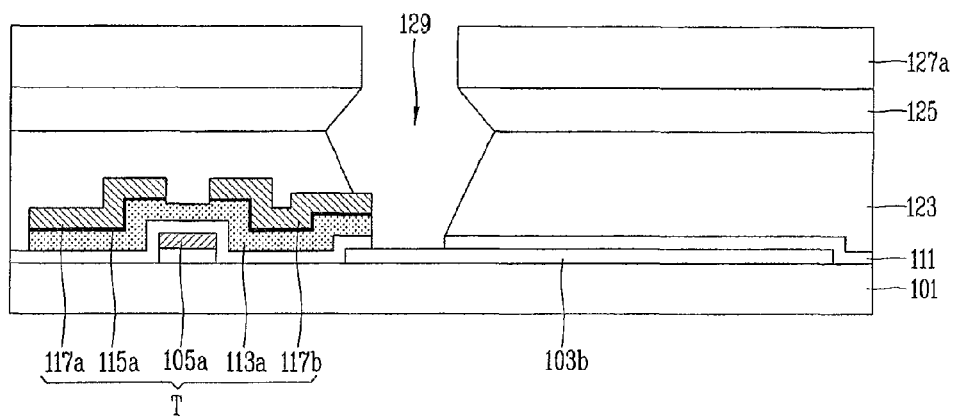
Figure 6N:
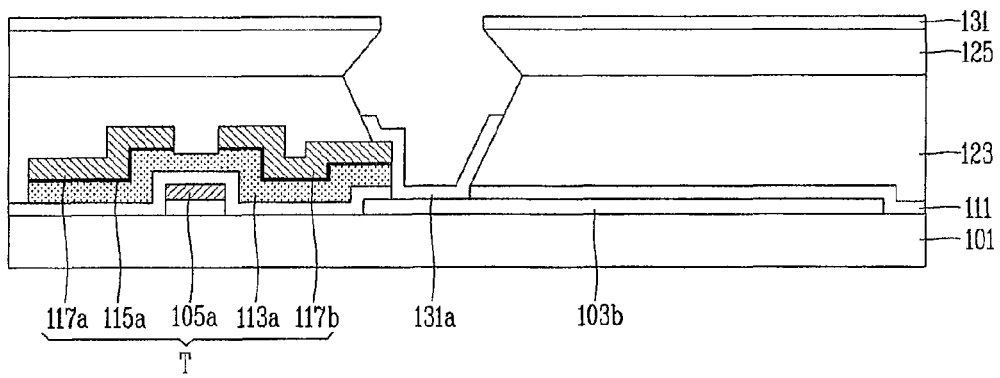
Figure 6O:
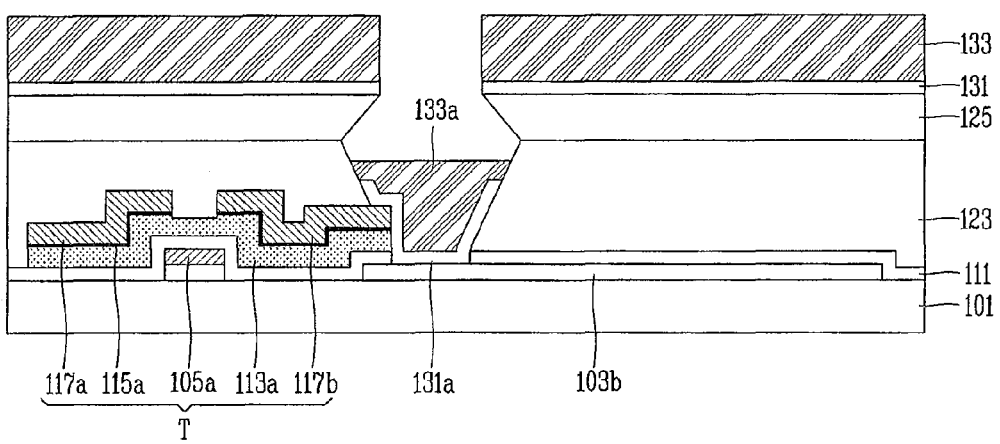
Figure 6P:
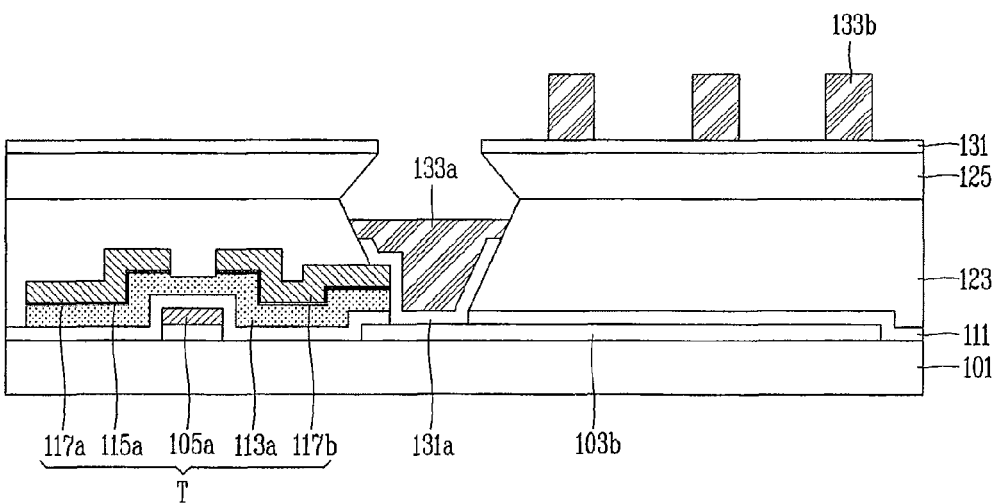
Figure 6Q:
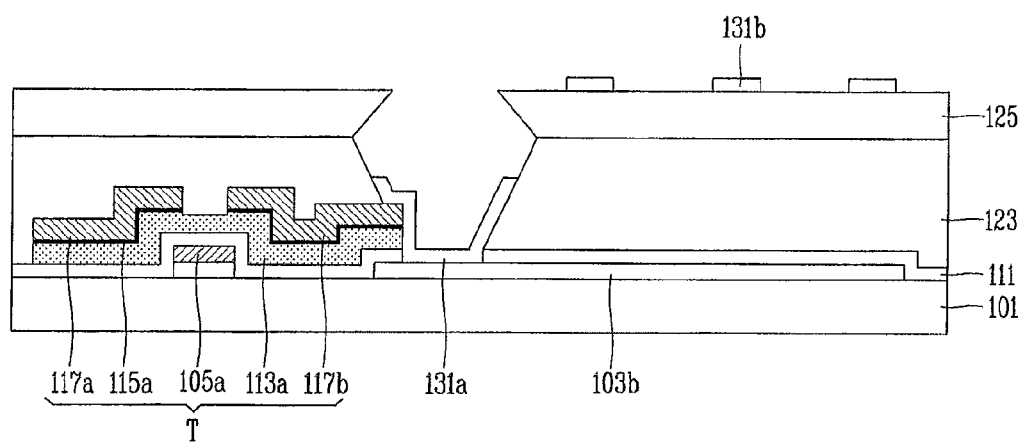

FIGS. 6A to 6Q are sectional views of a process for fabricating the array substrate for an LCD device according to an embodiment of the present invention.

As shown in FIG. 6A, a plurality of pixel regions including a switching region are defined on the transparent insulating substrate 101, and a first transparent conductive material layer 103 and a first conductive metal layer 105 are deposited on the transparent insulating substrate 101 through sputtering. In this case, the first transparent conductive material layer 103 may be made of any one selected from the group consisting of ITO and IZO.

Also, the first conductive metal layer 105 may be made of at least one selected from the conductive metal group consisting of aluminum (Al), tungsten (W), copper (Cu), molybdenum (Mo), chromium (Cr), titanium (Ti), molytungsten (MoV), molytitanium (MoTi), and copper/molytitanium (Cu/MoTi).

And then, photoresist having high transmittance is coated on the first conductive metal layer 105 to form a first photosensitive film 107.

Subsequently, as shown in FIG. 6B, an exposure process is performed on the first photosensitive film 107 by using a first diffraction mask 109 including a light blocking region 109a, a translucent region 109b, and a transmission region 109c. In this case, the light blocking region 109a of the first diffraction mask 109 is positioned at an upper side of the first photosensitive film 107 corresponding to a gate electrode formation region, and the translucent region 109b of the diffraction mask 109 is positioned at an upper side of the first photosensitive film 107 corresponding to a pixel electrode formation region. Also, besides the first diffraction mask 109, a mask using a diffraction effect of light, e.g., a half-tone mask, or any other masks, may also be used.

As shown in FIG. 6C, after the exposure process is performed, the first photosensitive film 107 is patterned through a developing process to form the gate electrode formation region 107a and the pixel electrode formation region 107b. Here, light has not transmitted through the gate electrode formation region 107a, so the thickness of the first photosensitive film 107 is maintained, while light has partially transmitted through the pixel electrode formation region 107b, so a certain thickness of the pixel electrode formation region 107b has been removed. Namely, the pixel electrode formation region 107b is thinner than the gate electrode formation region 107a.

Subsequently, as shown in FIG. 6D, the first conductive metal layer 105 and the first transparent conductive material layer 103 are patterned by using the gate electrode formation region 107a and the pixel electrode formation region 107b as masks to form a gate line (not shown), the gate electrode 105a protruded from the gate line, and the pixel electrode 103b. Here, when the first conductive metal layer 105 and the first transparent conductive material layer 103 are patterned, the first conductive metal layer pattern 105b and the second conductive material layer pattern 103a are also formed. Also, as shown in FIG. 4, the pixel electrode 103b is disposed to be separated from the gate line 105c and the data line 117c on the entire surface of the pixel region.

As shown in FIG. 6E, a portion of the thickness of the gate electrode formation region 107a on the gate electrode 105a and the pixel electrode formation region 107b on the first conductive metal layer pattern are selectively etched through an ashing process to completely remove the pixel electrode formation region 107b. Then, an upper portion of the first conductive metal pattern 105 is exposed.

As shown in FIG. 6F, the exposed first conductive metal layer pattern 105b is removed by using the gate electrode formation region 107a, a portion of the thickness of which has been etched through the ashing process, is removed by using the gate electrode formation region 107a as a blocking film, and the, the gate electrode formation region 107a of the first photosensitive film is also removed. At this time, the transparent first conductive material layer pattern 103a under the gate electrode 105a remains as it is, rather than being etched.

Thereafter, a gate insulating film 111 formed of a nitride silicon film (SiNxO or a silicon oxide film (SiO$_2$) is formed on the entire surface of the insulating substrate 101 including the gate electrode 105a and the pixel electrode 103b.

As shown in FIG. 6F, an amorphous silicon layer (a-Si:H) 113, an amorphous silicon layer (n+ or p+) 115 including impurities, and a second conductive metal layer 117 are sequentially stacked on the entire surface of the substrate 101 with the gate insulating film 111 formed thereon. At this time, the amorphous silicon layer (a-Si:H) 113 and the amorphous silicon layer (n+ or p+) 115 including impurities are deposited through chemical vapor deposition (CVD), and the second conductive metal layer 117 is deposited through sputtering. Here, the CVD method and the sputtering method are mentioned as the deposition methods, but any other deposition methods may be also used as necessary. At this time, the second conductive metal layer 117 may be made of at least one selected from the conductive metal group consisting of aluminum (Al), tungsten (W), copper (Cu), molybdenum (Mo), chromium (Cr), titanium (Ti), molytungsten (MoV), molytitanium (MoTi), and copper/molytitanium (Cu/MoTi).

As shown in FIG. 6G, photoresist having high transmittance is coated on the second conductive metal layer 117 to form a second photosensitive film 119.

Thereafter, an exposure process is performed on the second photosensitive film 119 by using a second diffraction mask 121 including a light blocking region 121a, a translucent region 121b, and a transmission region 121c. In this case, the light blocking region 121a of the second diffraction mask 121 is positioned at an upper side of the second photosensitive film 119 corresponding to a source and drain electrode formation region, and the translucent region 121b of the diffraction mask 121 is positioned at an upper side of the second photosensitive film 119 corresponding to a channel formation region of a TFT. Also, besides the second diffraction mask 121, a mask using a diffraction effect of light, e.g., a half-tone mask, or any other masks, may also be used.

As shown in FIG. 6H, after the exposure process is performed, the second photosensitive film 119 is patterned through a developing process to form a source and drain formation region 119a and a channel formation region 119b. Here, light has not transmitted through the source and drain electrode formation region 119a, so the thickness of the second photosensitive film 119 is maintained, while light has partially transmitted through the channel formation region 119b, so a certain thickness of the channel formation region 119b has been removed. Namely, the channel formation region 119b is thinner than the source and drain electrode formation region 119a.

As shown in FIG. 6I, the second conductive metal layer 117, the amorphous silicon layer 115 including impurities, and the amorphous silicon layer 113 are sequentially patterned by using the source and drain electrode formation region 119a and the channel formation region 119b as masks to form an ohmic-contact layer 115a and an active layer 113a on the gate insulating film 111 corresponding to the gate electrode 105a.

As shown in FIG. 6J, a portion of the thickness of the source and drain formation region 119a and the channel formation region 119b are completely removed through an ashing process. Here, an upper portion of the second conductive layer 117 is exposed from the channel area.

As shown in FIG. 6K, the second conductive layer 117 is patterned by using the source and drain electrode formation region 119a of the second photosensitive film, a portion of thickness of which has been removed, to form the source electrode 117a and the drain electrode 117b which are spaced apart.

Subsequently, the ohmic-contact layer 115a exposed between the source electrode 117a and the drain electrode 117b is also etched so as to be separated. Here, a channel region is formed on the active layer 113a positioned under the etched ohmic-contact layer 115a.

As shown in FIG. 6L, the source and drain electrode formation region 119a of the second photosensitive film is removed, a first insulating film 123 and a second insulating film 125 having heterogeneous characteristics are sequentially deposited on the entire surface of the substrate 101, and then, photoresist having high transmittance is coated on the second insulting film 125 to form a third photosensitive film 127.

Here, the first insulating film is formed of a silicon nitride film with rich nitrogen and is deposited to have a thickness ranging from about 3000 Å to about 5000 Å at a temperature ranging from about about 300° C. to about 800° C. Also, the second insulating film 125 is formed of a silicon nitride film with poor nitrogen and is deposited to have a thickness ranging from about 1000 Å to about 3000 Å at a temperature ranging from about about 100° C. to about 300° C. At this time, as for the rich and poor conditions of the silicon nitride film (SiN), when nitrogen rate is high based on a reference rate (e.g., Si:3, N:4), nitrogen is rich and when nitrogen rate is low based on the reference rate, nitrogen is poor. Here, the thickness of the first insulating film 123 and that of the second insulating film 125 are described to be limited, but the present invention is not limited thereto, and a different thickness range may be applied as necessary.

Thus, it can be considered that the first insulating film 123 has a high nitrogen (N) rate compared with silicon (Si), and the second insulating film 125 has a low nitrogen (N) rate compared with silicon (Si).

As shown in FIG. 6M, an exposure and developing process are performed through photolithography using an exposure mask (not shown) to pattern the third photosensitive film 127 to form a third photosensitive film pattern 127a.

As shown in FIG. 6N, the dual-structure insulating films, namely, the second insulating film 125 and the first insulating film 123, are dry-etched by using the third photosensitive film pattern 127a as a mask to form a contact hole 129 having an undercut shape. At this time, when the contact hole 129 is formed, a portion of the gate insulating film 111 is also etched to expose a portion of the underlying pixel electrode 103b. Also, when the contact hole 129 is formed, portions of the drain electrode 117b, the ohmic-contact layer 115a, and the active layer 113a are also exposed.

Meanwhile, since the second insulating film 125 and the first insulating film 123 have different characteristics, namely, different deposition temperatures or different content of nitrogen (N) over silicon (Si) contained therein, when the second insulating film 125 and the first insulating film 123 are dry-etched, the etching rate becomes fast toward the interface of these films in forming the contact hole 129. Thus, since the interface of the second insulating film 125 and the first insulating film 123 is more etched, the contact 129 finally has the sectional area structure having an undercut shape. Namely, the inner side face of the first insulating film 123 of the contact hole 129 has a tapered structure, and the inner side face of the second insulating film 124 has a reversely tapered structure. Thus, the width of a central portion of the contact hole 129 is larger than the upper and lower portions of the contact hole 129. Meanwhile, besides the deposition temperature or the nitrogen content rate, the second insulating film 125 and the first insulating film 123 may have any other physical characteristics.

Subsequently, the third photosensitive film pattern 127a is removed, and a second transparent conductive material layer 131 is deposited by using any one selected from the group consisting of ITO and IZO on the second insulating film 125 including the contact hole 129 through sputtering. At this time, when the second transparent conductive material layer 131 is deposited, an electrode separation phenomenon occurs due to the step between the upper and lower films, so a pixel electrode connection pattern 131a is formed to electrically connect the drain electrode 117b and the pixel electrode 103b within the contact hole 129. As for the electrode separation phenomenon due to the step between the upper and lower films generated when the transparent conductive material layer 131 is deposited, since the inner side face of the contact hole 129 has the undercut shape, the second transparent conductive material layer 131 is not deposited at the central portion of the inner side face of the contact hole 129, so the second transparent conductive material layer 131 is naturally separated. Thus, the second transparent conductive material layer 131 is formed only on the surface of the second insulating film 125, and only the pixel electrode connection pattern 131a is formed within the contact hole 129.

As shown in FIG. 6O, photoresist having high transmittance is coated on the second transparent conductive material layer 131 including the contact hole 129 with the pixel electrode connection pattern 131a formed thereon to form a fourth photosensitive film 133 and a cover photosensitive film 133a. At this time, the cover photosensitive film 133a is coated within the contact hole 129, completely covering the pixel electrode connection pattern 131a.

As shown in FIG. 6P, an exposure and developing process is performed through photolithography using an exposure mask (not shown) to pattern the fourth photosensitive film 133 to thus form a fourth photosensitive film pattern 133b. At this time, when the fourth photosensitive film 133 is patterned, the pixel electrode connection pattern 131a is completely covered by the cover photosensitive film 133a, the pixel electrode 103b cannot be exposed to be damaged. Namely, since the pixel electrode connection pattern 131a is completely covered by the cover photosensitive film 133a, when the fourth photosensitive film 133 is patterned, the phenomenon of the related art in which a portion of the pixel electrode is lost to cause a disconnection does not take place.

As shown in FIG. 6Q, the second transparent conductive material layer 131 is patterned by using the fourth photosensitive film pattern 133b as a mask to simultaneously form a plurality of separated common electrodes 131b having a bar-like shape and a common electrode connection pattern (not shown) (Refer to 131c in FIG. 4) connecting both ends of the plurality of common electrodes 131b.

Subsequently, although not shown, the cover photosensitive film 133a within the contact hole 129 including the fourth photosensitive film pattern 133b is removed, thus completing the process of fabricating the array substrate for an IPS mode LCD device according to an embodiment of the present invention.

Thereafter, although not shown, a color filter substrate fabrication process and a process of filling a liquid crystal layer between the array substrate and a color filter substrate are performed to fabricate the IPS mode LCD device according to an embodiment of the present invention.

As described above, according to the array substrate for an LCD device and its fabrication method, the dual-structure insulating films having heterogeneous characteristics, namely, the first silicon nitride film and the second silicon nitride film having a dual structure having different deposition temperature and the nitrogen content over silicon, are applied to cause an undercut phenomenon in performing the etching process to form the drain electrode and the pixel electrode connection contact hole. Thus, the electrode separation phenomenon occurs due to the step between the upper and lower films when the transparent conductive material layer (i.e., the ITO layer) is deposited, thus applying a high step between the protective film and the gate oxide film. Also, by using the phenomenon in which the photosensitive film remains at the contact hole portion with respect to the patterning exposure conditions of the transparent conductive material layer for forming the common electrodes, the underlying pixel electrode can remain without a loss due to the photosensitive film during wet etching.

Accordingly, the overlay margin between one end of the common electrode and the pixel electrode connection line and the short margin between the edge of one lateral side of the common electrode and the pixel electrode connection line can be reduced to the maximum in exposing the transparent conductive layer to increasing the area of the upper common electrodes, thus enhancing the aperture ratio and transmittance.

Also, since the array substrate for an IPS mode LCD device can be fabricated through a total of four masking processes, namely, through the first masking process for forming the gate electrode and the pixel electrode, the second masking process for forming the active layer and the source and drain electrodes, the third masking process for forming the contact hole to connect the drain electrode and the pixel electrode, and the fourth masking process for forming the common electrode. Thus, the number of fabrication processes can be shortened.

As the present invention may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

The invention claimed is:

1. A method for fabricating a liquid crystal display (LCD) device, the method comprising:
preparing a substrate;
forming a gate line arranged in one direction along with a pixel electrode on the substrate;
forming a data line crossing the gate line to define a pixel area;
forming a TFT at the crossing of the gate line and the data line;
stacking a first insulating film formed of a first silicon nitride film with rich nitrogen and a second insulating film formed of a second silicon nitride film with poor nitrogen on the entire surface of the substrate including the pixel electrode and the TFT;
patterning the second insulating film and the first insulating film to form a contact hole having an undercut shape exposing the pixel electrode and the TFT, wherein a width of the contact hole adjacent to the interface between the first and second insulating films is greater than a width of the contact hole adjacent to an upper surface of the second insulating film and a width of the contact hole adiacent to a lower surface of the first insulating film;
forming a transparent conductive layer on the second insulating film including the contact hole to form a pixel electrode connection pattern connected with the pixel electrode and the TFT within the contact hole having an undercut shape;
forming a photosensitive film on the transparent conductive layer including the pixel electrode connection pattern to a first photosensitive film pattern for covering completely the pixel electrode connection pattern; and
patterning the photosensitive film to form a second photosensitive film pattern on the transparent conductive layer; and
patterning the transparent conductive layer to form a plurality of common electrodes separately on the second insulating film.

2. The method of claim 1, wherein the forming of the gate line and the pixel electrode comprises:
sequentially forming a first transparent conductive material layer and a first conductive metal layer on the substrate;
coating a first photosensitive film on the first conductive metal layer;
patterning the first photosensitive film through a masking process using a first diffraction mask to form a first photosensitive film pattern having a first thickness and a second thickness smaller than the first thickness;
patterning the first conductive metal layer and the first transparent conductive material by using the first photosensitive film pattern as a mask to form the gate line and the pixel electrode together;
performing an ashing process to remove the first photosensitive film pattern having the second thickness;
removing the conductive metal layer under the portion from which the first photosensitive film pattern having the second thickness has been removed, to expose the pixel electrode; and removing the first photosensitive film pattern having the first thickness.

3. The method of claim 1, wherein the forming of the TFT comprises:
   forming a gate insulating film, an amorphous silicon layer, an amorphous silicon layer including impurities, and a second conductive metal layer on the entire surface of the substrate including the gate line and the pixel electrode;
   forming a second photosensitive film at an upper portion of the second conductive metal layer and patterning the same through a masking process using a second diffraction mask to form a second photosensitive film pattern having a first thickness and a second thickness smaller than the first thickness;
   patterning the second conductive metal layer, the amorphous silicon layer including impurities, and the amorphous silicon layer by using the second photosensitive film pattern as a mask to form a second conductive metal layer pattern, an ohmic-contact layer, and an active layer;
   removing the photosensitive film pattern having the second thickness through an ashing process to expose the second conductive metal layer at an upper portion of a channel region; and
   removing the exposed second conductive metal layer and the underlying ohmic-contact layer to form source and drain electrodes.

4. The method of claim 1, wherein the forming of the contact hole having the undercut shape exposing the pixel electrode and the TFT by selectively patterning the second insulating layer and the first insulating layer comprises:
   forming a third photosensitive film on the second insulating film and patterning the same to form a third photosensitive film pattern; and
   dry-etching the second insulating film and the first insulating film by using the third photosensitive film pattern as a mask to form the contact hole having the undercut shape.

5. The method of claim 1, wherein the contact hole having an undercut shape is configured by a tapered structure of the first insulating film and a reversely tapered structure of the second insulating film.

6. The method of claim 1, wherein the width of a central portion of the contact hole is larger than those of upper and lower portions of the contact hole.

7. The method of claim 3, wherein the pixel electrode connection pattern is in contact with an inner face of the first insulating film within the contact hole, the active layer, the drain electrode, and the pixel electrode.

8. The method of claim 1, wherein the first silicon nitride film is formed at a temperature ranging from about 300° C. to about 800° C., and the second silicon nitride film is formed at a temperature ranging from about 100° C. to about 300° C.

9. The method of claim 1, wherein the first silicon nitride film has a higher rate of nitrogen (N) over silicon (Si), and the second silicon nitride film has a lower rate of nitrogen (N) over silicon (Si).

10. The method of claim 2 or claim 3, wherein the first and second conductive metal layers are made of at least one selected from the conductive metal group consisting of aluminum (Al), tungsten (W), copper (Cu), molybdenum (Mo), chromium (Cr), titanium (Ti), molytungsten (MoV), molytitanium (MoTi), and copper/molytitanium (Cu/MoTi).

11. The method of claim 1, wherein the pixel electrode connection pattern and the common electrodes are made of the same conductive material.

* * * * *